(12) United States Patent
Bridgford

(10) Patent No.: US 7,506,210 B1
(45) Date of Patent: Mar. 17, 2009

(54) METHOD OF DEBUGGING PLD CONFIGURATION USING BOUNDARY SCAN

(75) Inventor: Brendan K. Bridgford, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 510 days.

(21) Appl. No.: 10/606,728

(22) Filed: Jun. 26, 2003

(51) Int. Cl.
G06F 11/00 (2006.01)

(52) U.S. Cl. .................... 714/37; 714/730
(58) Field of Classification Search .......... 714/37, 714/39, 725–735
See application file for complete search history.

(56) References Cited

U.S. PATENT DOCUMENTS

| | | | |
|---|---|---|---|
| 4,947,357 A | 8/1990 | Stewart et al. | |
| 5,457,408 A | 10/1995 | Leung | |
| 5,590,354 A * | 12/1996 | Klapproth et al. | 714/30 |
| 5,701,308 A | 12/1997 | Attaway et al. | |
| 5,805,607 A * | 9/1998 | Khu | 714/726 |
| 5,898,701 A * | 4/1999 | Johnson | 714/726 |
| 6,044,025 A * | 3/2000 | Lawman | 365/191 |
| 6,260,139 B1 * | 7/2001 | Alfke | 713/1 |
| 6,314,550 B1 | 11/2001 | Wang et al. | |
| 6,389,558 B1 * | 5/2002 | Herrmann et al. | 714/39 |
| 6,389,565 B2 * | 5/2002 | Ryan et al. | 714/724 |
| 6,553,523 B1 * | 4/2003 | Lindholm et al. | 714/725 |
| 6,594,802 B1 | 7/2003 | Ricchetti et al. | |
| 6,629,311 B1 * | 9/2003 | Turner et al. | 716/17 |
| 6,654,920 B1 | 11/2003 | Hetherington et al. | |
| 6,704,889 B2 * | 3/2004 | Veenstra et al. | 714/39 |
| 6,748,456 B1 * | 6/2004 | Stanton et al. | 710/1 |
| 6,800,884 B1 * | 10/2004 | Feng et al. | 257/209 |
| 6,826,100 B2 | 11/2004 | Ellis et al. | |
| 6,870,393 B2 | 3/2005 | Agarwal | |
| 6,920,627 B2 * | 7/2005 | Blodget et al. | 716/17 |
| 6,925,583 B1 | 8/2005 | Khu et al. | |
| 6,948,147 B1 | 9/2005 | New et al. | |
| 7,047,462 B2 * | 5/2006 | Brown et al. | 714/724 |
| 7,143,295 B1 | 11/2006 | Trimberger | |
| 7,155,370 B2 | 12/2006 | Nejedlo | |
| 7,159,046 B2 | 1/2007 | Mulla et al. | |
| 7,171,599 B2 | 1/2007 | Agarwal | |
| 7,248,070 B1 * | 7/2007 | Guilloteau et al. | 326/38 |
| 7,263,679 B2 | 8/2007 | Kuge et al. | |
| 2003/0140291 A1 * | 7/2003 | Brown et al. | 714/724 |

(Continued)

OTHER PUBLICATIONS

Introduction to JTAG Boundary Scan from http://web.archive.org/web/20020821074054/http://www.enr.udayton.edu/faculty/jloomis.*

(Continued)

Primary Examiner—Robert W Beausoilel, Jr.
Assistant Examiner—Amine Riad
(74) Attorney, Agent, or Firm—Justin Liu; John J. King

(57) ABSTRACT

Methods and tools for detecting and correcting problems arising in the configuration process of a programmable logic device are described. An analyzer is used to aid a user in debugging the configuration process. The analyzer can access the programmable logic device through a boundary scan architecture such as JTAG. The analyzer can step through the configuration process, capturing the data received by the programmable logic device at each step, and compare that captured data with expected data. Mismatches can indicate errors in the configuration process, and the analyzer can help a user correct such errors.

15 Claims, 5 Drawing Sheets

U.S. PATENT DOCUMENTS

2004/0015908 A1* 1/2004 Giel et al. .................. 717/141
2005/0166106 A1* 7/2005 Warren ...................... 714/724

OTHER PUBLICATIONS

Xilinx, Inc., "Virtex-II Platform FPGA Handbook," UG002, Dec. 6, 2000, Ch. 3, pp. 321-376, (v.1.0), available from Xilinx, Inc., 2100 Logic Drive, San Jose, CA 95124.

U.S. Appl. No. 10/955,807, filed Sep. 29, 2004, Jacobson.

Morgan, Gerry, "Boundary-Scan Testing: Part3: Some Board-Level DFT Guidelines," pp. 1-8, available from Asset InterTech, Inc., 2201 N. Central Expressway, Suite 105, Richardson, TX 75080-2718.

Choi, Y.-H. et al., "Configuration of a Boundary Scan Chain for Optimal Testing of Clusters of non Boundary Scan Devices,"IEEE, 1992, pp. 13-16, available from Department of Computer Science, University of Minnesota, Minneapolis, MN 55455.

Hansen, Peter, "Testing Conventional Logic And Memory Clusters Using Boundary Scan Devices As Virtual ATE Channels," IEEE, International Test Conference, 1989, paper 7.1, pp. 166-173, Available from Teradyne, Inc., 321 Harrison Avenue, Boston, MA 02118.

* cited by examiner

METHOD OF DEBUGGING PLD CONFIGURATION USING BOUNDARY SCAN

FIELD OF THE INVENTION

The invention relates to programmable logic devices (PLDs). More particularly, the invention relates to a method for debugging PLD configuration.

BACKGROUND OF THE INVENTION

A programmable logic device (PLD) is a well-known type of digital integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., DLLs, RAM, multipliers, processors).

The CLBs, IOBs, interconnect, and other logic blocks are typically programmed in a configuration process by loading a stream of configuration data (bitstream) into internal configuration memory cells that define how the CLBs, IOBs, and interconnect are configured. The configuration data can be read from memory (e.g., an external PROM (programmable read-only memory)) or written into the FPGA by an external device. The collective states of the individual memory cells then determine the function of the FPGA.

Another type of PLD is the complex programmable logic device (CPLD). A CPLD typically includes two or more "function blocks" or "macrocells" connected together and to input/output (I/O) resources by an interconnect switch matrix. Each function block of the CPLD includes a two-level AND/OR structure similar to those used in programmable logic arrays (PLAs) and programmable array logic (PAL) devices.

For all of these programmable logic devices, the functionality of the device is controlled by data bits, or configuration data, provided to the device for that purpose. The data bits can be stored in the PLD in volatile memory (e.g., static RAM cells, as in FPGAs and some CPLDs), in nonvolatile memory (e.g., flash memory, as in some CPLDs), or in any other type of memory cell. In some cases, particularly where the PLD stores configuration data in volatile memory, the data is provided to the PLD by an external nonvolatile device. For example, an FPGA can be configured by an external nonvolatile memory such as a PROM. In this way, configuration data can be preserved when power is not being supplied to the system. As another example, configuration data can be provided to a PLD by another external configuration device, such as a processor or microcontroller.

PLDs that store configuration data in volatile memory receive that data during the configuration process. Typically, at power-up (or at any other time a PLD is configured), the external configuration device, such as an external PROM or processor, transfers the configuration data to the volatile memory of the PLD through a pre-defined interface. For example, the configuration processes for the Virtex™-II series of FPGAs manufactured by Xilinx®, Inc. of San Jose, Calif. ("Xilinx"), is set forth in Chapter 3 of the "Virtex-II Platform FPGA Handbook," UG002 (v1.0) 6 Dec. 2000 (the "Virtex-II Handbook"), which is incorporated herein by reference.

As is common in all electronic designs, a designer often faces the challenge of debugging a non-functional design. When designing for a PLD, there are many possible reasons that a PLD may fail to function as intended by the designer. One problem unique to PLDs that can cause failure is a problem arising during the configuration process. For example, the configuration data being supplied to the PLD from the external configuration device may have been corrupted in transit. As another example, the external configuration device may be providing the wrong or otherwise flawed bitstream. Many other problems can occur during the configuration process. Often these problems can be difficult, or even impossible, for most users to debug.

Therefore, there is a need for methods and tools for debugging the configuration process in PLDs.

SUMMARY OF THE INVENTION

A method for debugging the configuration process of a programmable logic device includes detecting and analyzing the configuration sequence. In one embodiment, the configuration sequence is detected through a JTAG boundary scan interface. The JTAG interface can be used to step through the configuration process and capture configuration data and signals. Knowledge about the target PLD and the intended configuration allows a user to analyze captured data and determine the cause of a fault during the configuration process.

A system for debugging the configuration process of a programmable logic device includes a configuration analyzer that monitors and observes the configuration process and the signals that pass between a PLD and its associated external configuration device. Problems arising during the configuration process can be detected by the analyzer. In some embodiments, the analyzer can be a computer connected to a JTAG interface.

Additional novel aspects and embodiments are described in the detailed description below. The appended claims, and not this summary, define the scope of the invention.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of systems for designing and verifying applications for programmable logic devices. While the present invention is not so limited, an appreciation of the present invention is presented by way of specific examples. Specific details are set forth to provide a more thorough understanding of the present invention. However, it will be apparent to one ordinarily skilled in the art that the present invention can be practiced without these specific details. In other instances, well-known circuits and devices may be omitted, or presented in abstract form, in order to avoid obscuring the present invention.

Figure 1:
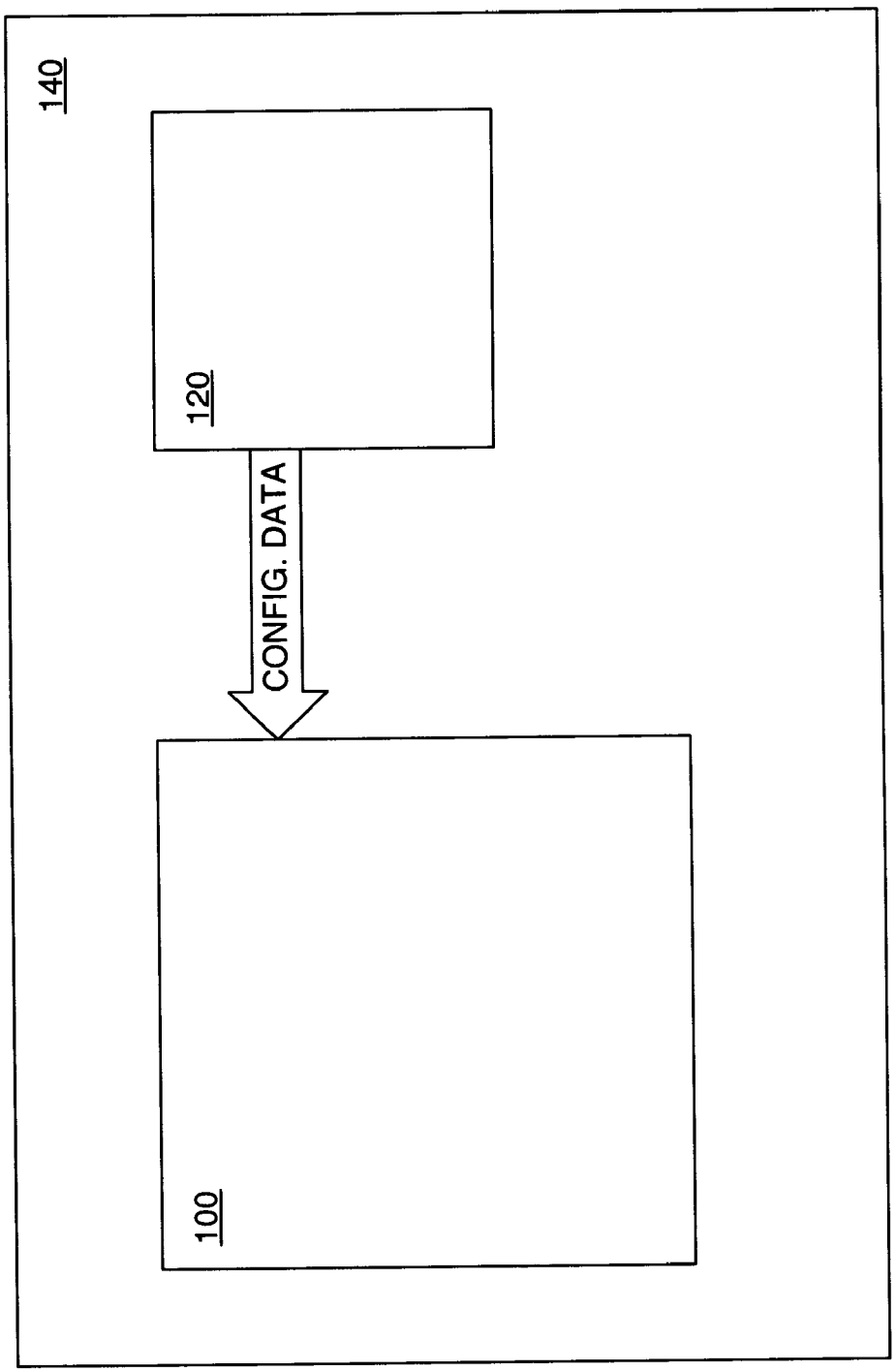
FIG. 1 shows an example of a programmable logic device with an external configuration device for configuring the PLD.

FIG. 1 shows an example of a typical arrangement for configuration of a programmable logic device. A PLD 100 is coupled to a configuration device 120 that provides configuration data for PLD 100. When PLD 100 is being configured to perform its specified functions, for example at power up, configuration device 120 transfers the configuration data to PLD 100 via a predefined interface. The configuration data configure the programmable resources (such as CLBs, IOBs, a programmable interconnect structure, and other programmable resources) of PLD 100. This configuration process specifies the functionality of PLD 100. For instance, PLD 100 can be an FPGA, and configuration device 120 can be a PROM. The PROM stores the configuration data persistently, and can transfer the data to the volatile storage (such as SRAM) on the FPGA, thereby configuring the FPGA.

As an example, Chapter 3 of the Virtex-II Handbook describes multiple ways to configure the Virtex-II series of FPGAs manufactured by Xilinx. For instance, a Virtex-II FPGA can be configured in the Master Serial configuration mode, wherein the Virtex-II FPGA to be configured acts as a "master" in controlling the configuration process as a configuration device transfers configuration data serially to the FPGA. Other configuration modes for PLDS are also available, and are well known to those of ordinary skill in the art.

Regardless of which programming mode is used, it can be difficult to debug problems that arise during or as a result of the configuration process. Typically, PLD 100 and its associated configuration device 120 are integrated circuits (ICs) attached to a printed circuit board (PCB) 140 where it may be inconvenient or impossible to probe all of the configuration signals that pass between PLD 100 and configuration device 120. For example, a user may design a circuit to be implemented on an FPGA and write the corresponding bitstream to the PROM. The user then supplies power to the system, starting the configuration process, and the PROM starts to output configuration data to the FPGA. If there is a problem during this configuration process, the FPGA will not be correctly configured and will not function as intended. Many FPGAs use only a single bit (for example a "done" pin) to indicate that configuration is completed correctly. If such an FPGA fails to assert its "done" pin (i.e., the configuration was not completed), the user typically has no other information regarding the cause of the failure, and trying to discover and fix the problem can be a difficult task. The present invention provides the user with tools and methods to simplify debugging and correcting such configuration problems.

The JTAG standard (named for the Joint Test Action Group, the technical subcommittee that initially developed the standard), also known as IEEE 1149.1, provides a means to ensure the integrity of individual integrated circuits, and the interconnections between them. A related standard, IEEE 1532, provides similar functionality. JTAG is a boundary scan architecture that allows data to be sent to and received from the I/O pins of an integrated circuit, and can be used to test ICs.

The JTAG standard requires four pins to control the JTAG TAP (test access port) controller: TDI, TDO, TMS, and TCK. The TAP controller, a 16-state state machine, and these four pins provide access to other elements of the JTAG standard, such as an instruction register, a boundary scan register, and a bypass register. Every JTAG-compliant component will have an implementation of the TAP controller state machine. In a system with multiple ICs, each with a JTAG interface, the ICs can be connected together to form a JTAG chain. In such chains, the TDO output of one IC is connected to the TDI input of the succeeding IC in the chain; TMS and TCK are shared among all the ICs. These and other details about the IEEE 1149.1 and 1532 standards are well known to those of ordinary skill in the art.

JTAG provides for several standard instructions, including the BYPASS, EXTEST, and SAMPLE/PRELOAD instructions, for testing ICs. These instructions can be accessed by loading the JTAG instruction register with an appropriate binary code. Running the BYPASS instruction on an IC causes the IC to pass data received at TDI through a 1-bit bypass register to the TDO output. This instruction is commonly used to bypass a particular IC in a JTAG chain in order to reach other devices in the chain. The SAMPLE/PRELOAD and EXTEST instructions are used together in order to test external connections among ICs. Typically, each input/output (I/O) pin on an IC will have at least one JTAG data register, and may have more than one such register. These data registers are collectively known as the boundary scan register and can be accessed one at a time through the JTAG interface.

In a typical use of the EXTEST JTAG instruction, a user will first use the SAMPLE/PRELOAD instruction to "preload" data, which will be used to drive output pins from the IC, into the boundary scan register. Then, the user will initiate the EXTEST instruction, which causes the IC to assert specific outputs at its I/O pins, based on the data in the boundary scan register. The IC then captures (or "samples") the states of its I/O pins, and scans these data samples out of the IC through the boundary scan register with another SAMPLE/PRELOAD instruction. The SAMPLE/PRELOAD instruction scans out the captured boundary scan data while scanning in the next vector of "preloads." Using alternating SAMPLE/PRELOAD and EXTEST instructions in this way allows a user to single step a system and to observe and assert signals to and from an IC through the JTAG interface. This can be a powerful tool in debugging a design. Note that while the IC is in EXTEST mode, its I/O pins are controlled only by the JTAG interface, and more specifically, are not controlled by the core (i.e., the non-I/O portions) of the chip. That is, the JTAG interface can essentially suspend normal operation of an IC and provide a user with direct access to the I/O pins of an IC to assert and capture signals at those pins.

Figure 2:
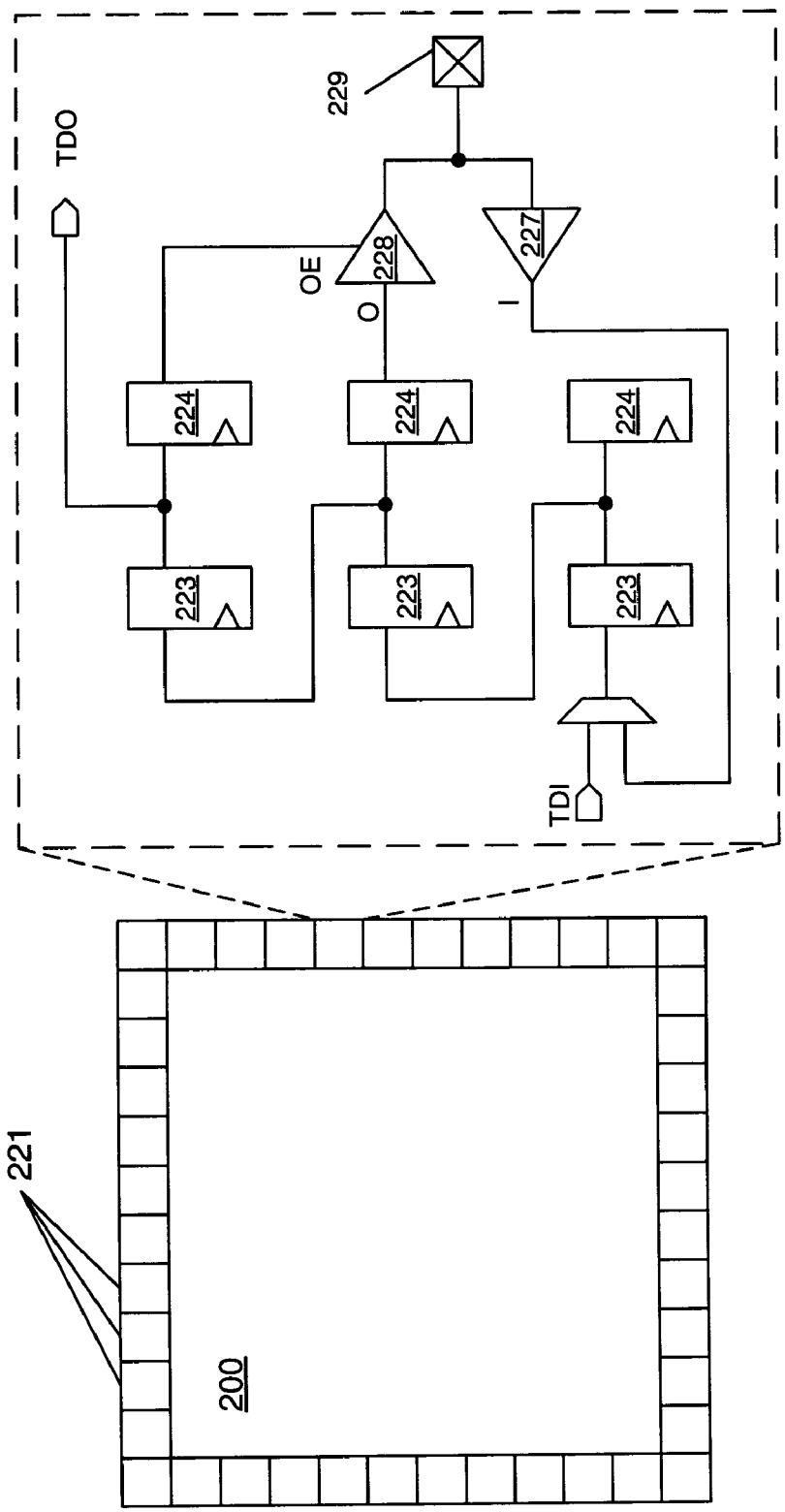
FIG. 2 shows an example of a programmable logic device including logic for implementing JTAG boundary scan functionality.

As previously stated, problems often arise during the configuration process of a PLD that can be difficult to debug. However, by taking advantage of the JTAG interface built into many PLDS, debugging the configuration process can be significantly simplified. FIG. 2 shows an example of a PLD 200 having multiple IOBs 221. Each IOB 221 includes logic for implementing the JTAG standard, as shown in the detailed view of an IOB in FIG. 2. That logic can include one or more boundary scan registers 223, one or more corresponding local storage registers 224, and other supporting logic. In the example shown, three boundary scan and three local registers are used to interact with three basic signals that define the state of an IOB: a data out O, an output enable EN, and an input I.

FIG. 2 shows the JTAG registers connected in a configuration for performing EXTEST operations; other connections corresponding to other modes are not shown for clarity. Also, other register configurations can be used, depending on the behavior and functionality of the IOBs in the particular PLD being debugged. In performing a JTAG test, a user can execute the SAMPLE/PRELOAD instruction to scan in data into registers 223. Then, when the EXTEST instruction is executed, the data in the registers 223 is transferred over to registers 224, thereby causing a value to be asserted at the I/O pin 229, depending on the signals driving a tristate buffer 228.

On the next SAMPLE/PRELOAD instruction, the value at I/O pin 229 is captured through an input buffer 227 into the boundary scan registers. This captured input data can then be scanned out through the boundary scan register as a new output vector is scanned in.

Figure 3:
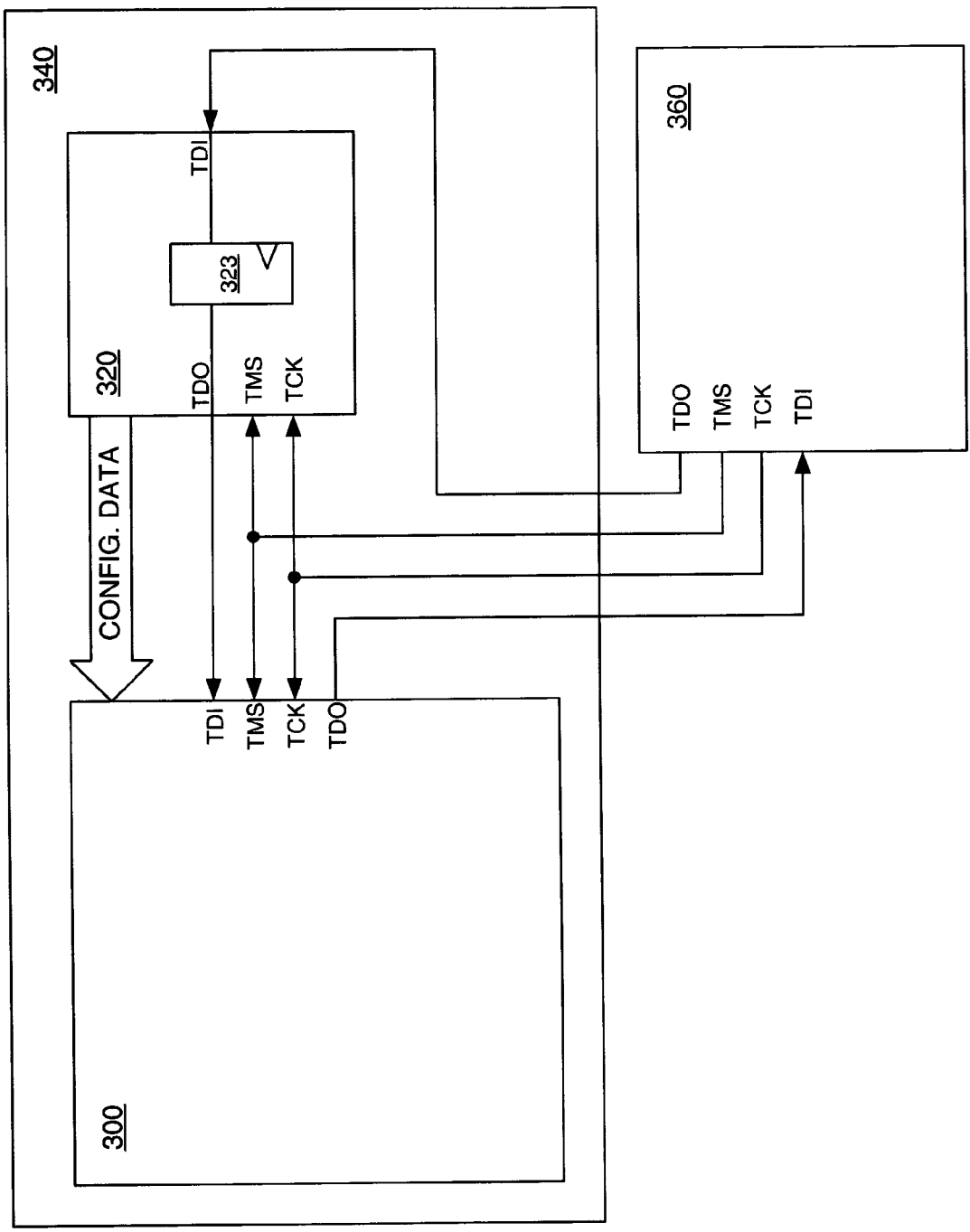
FIG. 3 shows an example of a system for debugging the configuration process of a programmable logic device according to the invention.

FIG. 3 shows a system in accordance with the present invention. The system includes a PLD 300 and a configuration device 320 for configuring PLD 300, both attached to a PCB 340. In this example, the IOBs of PLD 300 are each configured for executing the JTAG EXTEST instruction, in substantially the same manner as described above with respect to FIG. 2. Configuration device 320 is on the same JTAG chain as PLD 300. The TDO pin of configuration device 320 is connected to the TDI pin of PLD 300, and PLD 300 and configuration device 320 share TMS and TCK signals, thereby forming a JTAG chain. Furthermore, configuration device 320 is placed in the JTAG BYPASS mode, and therefore, data received at the TDI pin of configuration device 320 is passed to its TDO pin through a single bypass register 323. Note that other JTAG chain configurations are possible, as will be known to those of ordinary skill in the art. For example, the order of PLD 300 and configuration device 320 in the chain can be reversed. Also, other JTAG-compliant devices can be added to the chain.

A configuration analyzer 360 is connected to the JTAG interface signals as the termination point of the JTAG chain. Analyzer 360 drives the TMS and TCK signals, sources data for the start of the chain, the TDI input pin of configuration device 320, and receives data from the end of the chain, in this example the TDO output of PLD 300. In an embodiment, analyzer 360 can be an external unit connected to PCB 340, for example, through a cable (such as a parallel cable). In another embodiment, analyzer 360 can be located on PCB 340.

As stated above, configuration device 320 is in the JTAG BYPASS mode; that is, the JTAG instruction register of configuration device 320 contains the binary code corresponding to the BYPASS instruction. This means that configuration device 320 does not process JTAG data arriving on its TDI input, and merely shifts data from its TDI input to its TDO output on each TCK clock pulse. Alternatively, configuration device 320 need not be part of the JTAG chain (for example, if configuration device 320 does not support the JTAG standard), and analyzer 360 can be coupled just to PLD 300 (and any other devices that may be in the JTAG chain).

Since configuration device 320 is "bypassed," it does not process JTAG data, and therefore operates normally. By using the SAMPLE/PRELOAD and EXTEST instructions on PLD 300, the configuration process for PLD 300 can be debugged. For example, a user can use analyzer 360 to preload appropriate signals on the outputs of PLD 300 in order to cause configuration device 320 to start providing configuration data. By placing PLD 300 in EXTEST mode and mimicking the signals PLD 300 would normally produce during the configuration process, configuration device 320 is effectively "fooled" into providing configuration data. The configuration data are received by PLD 300 and can be captured by using the SAMPLE/PRELOAD instruction. The data can then be scanned out through the JTAG interface to analyzer 360, and the next set of output vectors scanned in to PLD 300. Thus, a user can single-step through the configuration process, capturing the bitstream and other signals received by PLD 300 at each step of the configuration process.

FIGS. 4A-4F illustrate an example where JTAG instructions and registers are used to cause PLD 300 to send normal configuration process signals, thereby causing configuration device 320 to provide the configuration bitstream, and to allow a user to single-step through the configuration process. The configuration bitstream provided by configuration device 320 can then be scanned out of PLD 300 and analyzed by analyzer 360 for possible configuration problems. FIGS. 4A-4F show a simplified view of a portion of the boundary scan registers for three configuration I/O pins of an example PLD. The figures show the state of the registers for the two output configuration signals INIT_B and CCLK, and for the input configuration signal DIN. The example is based on the Master Serial programming mode for the Virtex-II series of FPGAs from Xilinx, described in greater detail in Chapter 3 of the Virtex-II Handbook. Certain specific details are omitted in the figures (and the accompanying description) to avoid obscuring the invention, as will be readily apparent to those of ordinary skill in the art.

Figure 4A:
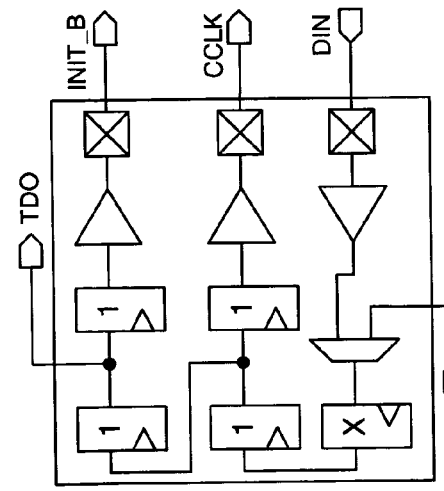
FIGS. 4A-4F show an example of the states of certain JTAG registers in a programmable logic device in a configuration sequence according to the invention.
Figure 4B:
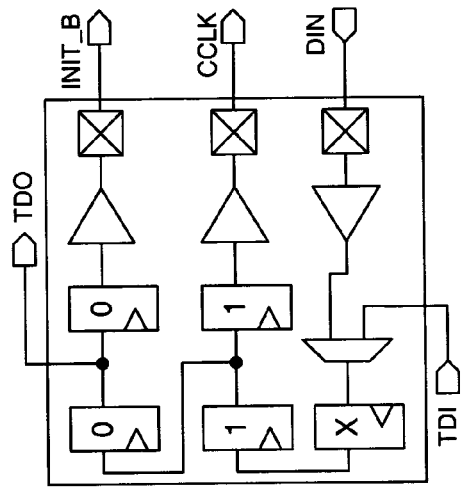
Figure 4C:
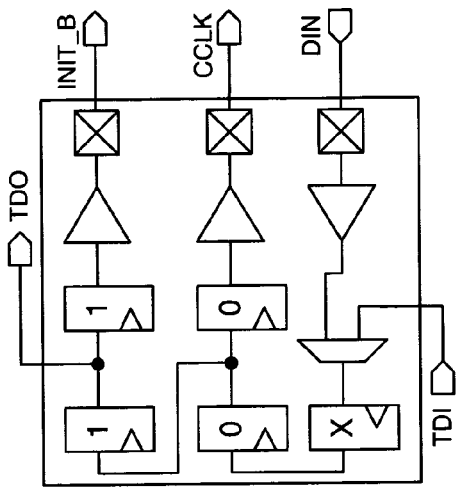
Figure 4D:
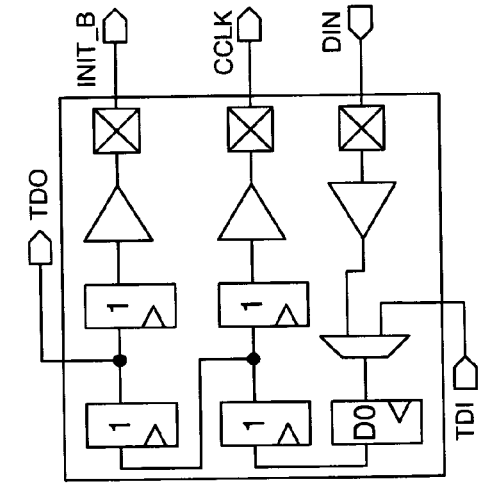
Figure 4E:
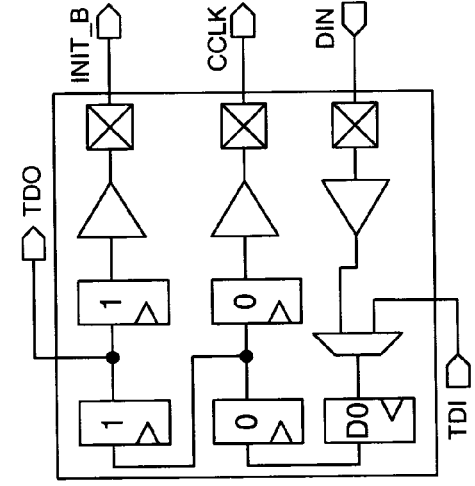
Figure 4F:
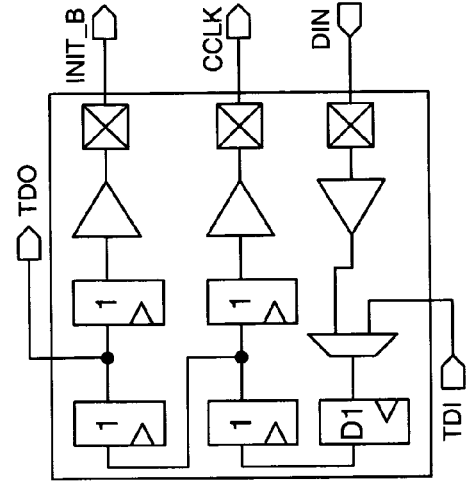

In FIG. 4A, a first vector is scanned in to the boundary scan registers (on the left side in the figure) of the PLD through a serial interface, for example by a SAMPLE/PRELOAD instruction. An EXTEST instruction is then used to transfer the "preload" values to the outputs of the PLD (via the registers on the right side of the PLD). In FIG. 4A, logic 1's are asserted at the INIT_B and CCLK outputs. At the next step in the configuration process, as shown in FIG. 4B, a second vector is scanned in to the PLD and asserted at its output, for example with another set of SAMPLE/PRELOAD and EXTEST instructions. In this second step, a logic 0 is asserted at INIT_B, and a logic 1 at CCLK. In this example, INIT_B, an active low signal, can be used to initialize the external device. Next, in FIG. 4C, INIT_B is a logic 1 and CCLK begins to toggle. CCLK can be the clock signal used to clock in the configuration bitstream at data input DIN. In FIG. 4D, as CCLK toggles from a logic 0 to a logic 1, the configuration device begins to provide the configuration data, and first configuration data input bit D0 is received at the PLD. Data bit D0 is sampled and stored in the boundary scan register, and can then be scanned out to the analyzer through the JTAG interface by using the SAMPLE/PRELOAD instruction. In FIG. 4E, CCLK pulses low (logic 0), and then in FIG. 4F pulses high (logic 1), thereby causing the configuration device to provide the next configuration data input bit D1, which can also be scanned out using JTAG. This process can be repeated until the entire configuration bitstream has been provided by the configuration device, one step at a time, and that bitstream has been captured and scanned out of the PLD to the analyzer. Other signals of interest to the user can be asserted and/or captured in the same or a similar manner, as will be readily understood by one of ordinary skill in the art.

Based on the captured configuration process data, analyzer 360 of FIG. 3 can observe each step of the configuration process and detect any problems arising during that process. In some embodiments, analyzer 360 is a computer running a program that can control the JTAG process and analyze the configuration process. For example the iMPACT program, provided by Xilinx for use with its programmable logic devices, can be used to access and control a PLD through a JTAG interface. Analyzer 360 can verify and ensure that PLD 300 is receiving appropriate signals during the configuration process.

For example, analyzer 360 can verify the connectivity between PLD 300 and configuration device 320. Common problems in the configuration process include incorrect connections and signal integrity problems between the ICs. Based on known characteristics of PLD 300, and the configuration mode being used, analyzer 360 can determine if an incorrect or inappropriate configuration signal is reaching PLD 300 and causing a configuration error. For instance, in some FPGAs manufactured by Xilinx, the configuration process can fail if a particular input pin (namely, the /CS input pin) to the FPGA is toggling while attempting to configure the FPGA in serial mode. Analyzer 360 can therefore monitor this particular pin and detect this problem if it occurs during configuration. This is an obscure problem that can be difficult to debug using conventional means. A user may not know to look for this problem, or may not have access to probe the state of this pin. In another example, a user may have inadvertently connected PLD 300 and configuration device 320 incorrectly, thereby causing PLD 300 to receive the wrong configuration signals. A signal integrity problem (such as interference or excessive loading) can also cause PLD 300 to receive the wrong configuration signals. In these and other similar cases, analyzer 360 can detect configuration problems and inform the user that signals inconsistent with the configuration process are being received at PLD 300. Furthermore, the analyzer can highlight for the user the specific errors in order to aid the user in fixing the problem.

A common problem in the configuration process can occur when configuration device 320 provides the wrong bitstream. In this case, the analyzer can be used to verify that the configuration bitstream provided by configuration device 320 to PLD 300 matches the user's intended bitstream. For example, external device 320 may be attempting to provide a bitstream corresponding to the wrong design. Or, the bitstream may be in a format targeted for a different type of PLD. Another common configuration problem can result from an error in programming configuration device 320. For instance, there may have been a signal integrity problem when configuration device 320 was programmed, or configuration device 320 may be faulty. In these types of cases, analyzer 360 can compare the intended bitstream with the bitstream actually received at PLD 300, and flag any mismatches as errors to the user. That is, a user can designate an intended bitstream, and use analyzer 360 to verify that the intended bitstream is actually received at the inputs to PLD 300. Analyzer 360 can also access an identification register in PLD 300, which can identify the type of device that PLD 300 is, through the JTAG interface, or can identify the target device based on user input. Based on the identification data and the observed configuration bitstream, which can include information about the type of device for which the bitstream is targeted, analyzer 360 can determine if the bitstream is in the correct format for that type of PLD.

The analyzer can also perform more advanced debugging and not only detect a problem in the configuration process, but also suggest possible solutions to the user. For instance, if the incorrect configuration signals are being received at PLD 300, analyzer 360 can determine if two or more connections between PLD 300 and external device 320 have been swapped. If so, analyzer 360 can identify the swapped connections and instruct the user as to how to correct the connections. Analyzer 360 can also be supplemented by a database of common or known configuration problems having known solutions, and can use such a database to provide solutions to the user. The analyzer can compare the configuration signals it receives against the list of known problems. If there is a match to a known problem, the analyzer can suggest solutions that have worked for other users having the same problem. An example of such a known problem is the toggling /CS input to certain Xilinx FPGAs described above. In this example, the database can have a record of this known problem and the analyzer can check the /CS input to see if this known problem is occurring. Such a database can encompass data from a large sample of users and designs, thereby giving a user the benefit of the experience of that large sample of users and the problems encountered in those designs.

Figure 5:
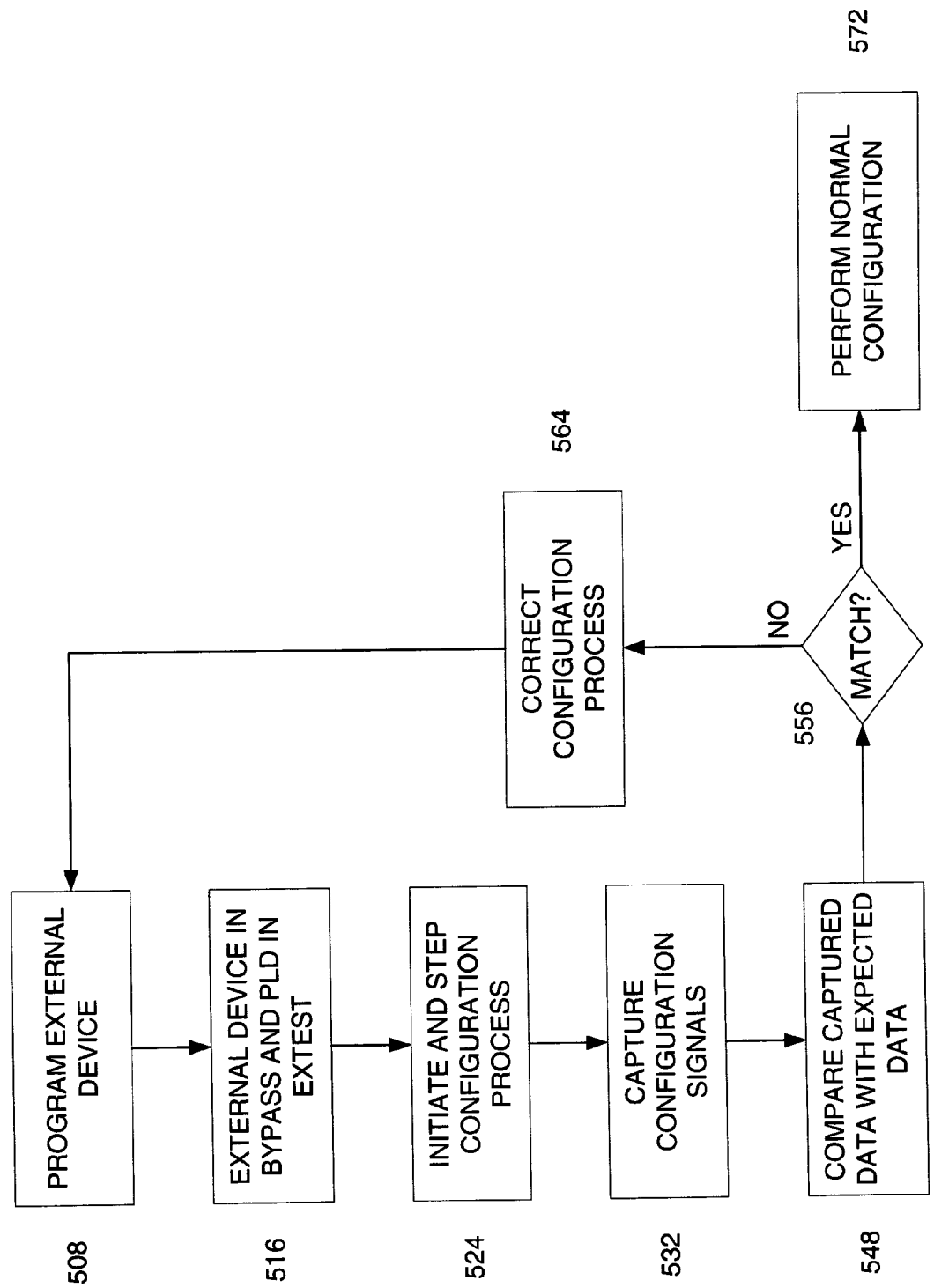
FIG. 5 shows an example of a flow diagram of a method for debugging the configuration process of a programmable logic device according to the invention.

FIG. 5 shows a flow diagram of the basic steps a user can take in debugging the configuration process of a PLD. In step 508, the user programs a configuration device that will be used to configure the PLD. For example, this step can comprise programming a PROM with a configuration bitstream. In step 516, the configuration device is placed in a bypass mode (for instance, by executing the JTAG BYPASS instruction) and the PLD is prepared to execute the JTAG EXTEST instruction. As described in greater detail above, the EXTEST instruction, typically used in conjunction with the JTAG SAMPLE/PRELOAD instruction, allows a user to assert and capture data at the I/O pins of the PLD directly. In step 524, by using appropriate JTAG instructions, the user can initiate and step through the configuration process. The user asserts signals at the I/O pins of the PLD that cause the external configuration device to start transferring configuration data to the PLD. Preferably, the PLD is in a "master" configuration mode, which means that the PLD controls the configuration process.

In step 532, the configuration data and signals received at the PLD are captured as the user steps through the configuration process. Then, in step 548, the captured data is compared with the expected data. That is, the user uses an analyzer to compare the data received at the PLD with the data that is expected, based on factors such as the design, target PLD type, and configuration mode. If, in a decision step 556, the captured data and the expected data do not match, then there is a problem in the configuration process. In step 564, based on the error or errors detected, the user can make changes to the configuration setup and attempt to correct the detected problems in the configuration process. In some embodiments, the analyzer or other debugging tools can be used to help the user correct the detected problems. After correcting the errors in the configuration setup, the user can repeat the earlier steps (steps 508-556) with the newly corrected process and see if any further errors are detected. If, at decision step 556, the captured data and the expected data match, then the user can have a high confidence that the configuration setup is working properly. The user can then proceed to step 572, and attempt normal configuration (i.e., both the PLD and its associated external configuration device are operating normally).

It will be apparent to one ordinarily skilled in the art after reading this specification that the present invention can be practiced within these and other architectural variations. For example, one or more steps of the methods of the present invention can be performed in hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code) stored in any computer-readable medium (e.g., ROM, RAM, magnetic media, punched tape or card, compact disc (CD) in any form, DVD). Further, such software can also be in the form of a computer data signal embodied in a carrier wave, such as that found within the well-known Web pages transferred among computers connected to the Internet. Accordingly, the present invention is not limited to any particular platform.

Those having ordinary skill in the relevant arts of the invention will now perceive various modifications and additions that can be made as a result of the disclosure herein. For example, the above text describes the circuits and methods of the invention in the context of a single FPGA and a single PROM for configuring the FPGA. However, the circuits of the invention can also be implemented in other systems, for example, having multiple PLDs, multiple configuration devices, and/or multiple PCBs.

Accordingly, all such modifications and additions are deemed to be within the scope of the invention, which is to be limited only by the appended claims and their equivalents.

What is claimed is:

1. A method for debugging a configuration process of a device having programmable logic and a JTAG interface comprising:

providing a first connection between a configuration device and the device having programmable logic through the JTAG interface;

providing a second connection between the configuration device and an input/output pin of the device having programmable logic which is separate from the JTAG interface;

initiating the configuration process for the device having programmable logic;

coupling configuration process signals to the input/output pin of the device having programmable logic;

using boundary scan registers of the device having programmable logic to capture the configuration process signals received at the input/output pin of the device during the configuration process;

using the boundary scan registers to transfer the captured configuration process signals to a configuration analyzer during the configuration process;

analyzing the transferred configuration process signals using the configuration analyzer; and verifying the second connection between the configuration device and the input/output pin of the device having programmable logic coupled to receive the configuration process signals.

2. The method of claim 1 further comprising programming the configuration device coupled to the device having programmable logic with a configuration bitstream.

3. The method of claim 2 wherein initiating the configuration process comprises causing the device having programmable logic to send normal configuration process signals to the configuration device, thereby causing the configuration device to provide the configuration bitstream.

4. The method of claim 1 wherein initiating the configuration process comprises accessing the device having programmable logic through the JTAG interface.

5. The method of claim 4 further comprising:
executing a SAMPLE/PRELOAD instruction on the device having programmable logic; and
executing an EXTEST instruction on the device having programmable logic.

6. The method of claim 5 further comprising executing a BYPASS instruction on a configuration device coupled to the device having programmable logic.

7. The method of claim 1 wherein analyzing the transferred configuration process signals comprises comparing the transferred configuration process signals with expected configuration process signals.

8. The method of claim 7 wherein if the transferred configuration process signals and the expected configuration process signals do not match, then correcting the configuration process.

9. A system comprising:
a device having programmable logic and a JTAG interface coupled to boundary scan registers, the device coupled to receive a configuration bitstream by way of an input/output (I/O) pin separate from the JTAG interface;
a configuration device coupled to the I/O pin of the device having programmable logic for providing the configuration bitstream to the device having programmable logic by way of the I/O pin, the configuration device further separately coupled to the device having programmable logic via through the JTAG interface; and
a configuration analyzer coupled to the configuration device for driving configuration process signals through the configuration device in single steps, and coupled to the device having programmable logic for controlling I/O pins of the device having programmable logic and analyzing configuration process signals stored in the boundary scan registers of the device having programmable logic during the configuration process;
wherein the device having programmable logic, the configuration device, and the analyzer form at least part of a JTAG chain enabling verifying a connection to the input/output pin of the device having programmable logic coupled to receive the configuration bitstream.

10. The system of claim 9 wherein the configuration device is a nonvolatile memory.

11. The system of claim 9 wherein the programmable logic device having programmable logic is a field programmable gate array.

12. The system of claim 9 wherein the analyzer comprises a computer running a program for analyzing the configuration data.

13. The system of claim 12 wherein the analyzer comprises a database of known configuration problems.

14. A machine readable storage having stored thereon, a computer program having a plurality of code sections for debugging a configuration process of a device having programmable logic and a JTAG interface, the code sections executable by a machine for causing the machine to perform the steps of:
initiating the configuration process for the device having programmable logic;
coupling JTAG signals to the JTAG interface of the device having programmable logic;
coupling configuration process signals to an input/output pin of the device having programmable logic, wherein the input/output pin is separate from the JTAG interface:
using boundary scan registers of the device having programmable logic to capture the configuration process signals received at the input/output pin of the device having programmable logic during the configuration process;
using the boundary scan registers to transfer the captured configuration process signals to a configuration analyzer during the configuration process;
analyzing the transferred configuration process signals using the configuration analyzer; and
verifying a connection to the input/output pin of the device having programmable logic coupled to receive the configuration process signals.

15. A configuration analyzer for debugging a configuration process of a device having programmable logic and a JTAG interface comprising:
means for receiving JTAG signals by way of the JTAG interface of the device having programmable logic;
means for receiving configuration process signals by way of an input/output pin of the device having programmable logic separate from the JTAG interface;
means for stepping through the configuration process;
means for capturing configuration process signals received at the input/output pin in boundary scan registers as the configuration process signals are received by the device having programmable logic at each step;
means for comparing the captured configuration process signals output by the boundary scan registers in a JTAG chain with expected configuration process signals during the configuration process; and
means for verifying a connection to the input/output pin of the device having programmable logic coupled to receive the configuration process signals.

* * * * *